United States Patent [19]
Kondo et al.

[11] Patent Number: 4,780,572
[45] Date of Patent: Oct. 25, 1988

[54] DEVICE FOR MOUNTING SEMICONDUCTORS

[75] Inventors: Kazuo Kondo; Masateru Hattori; Tatsunori Kurachi, all of Aichi, Japan

[73] Assignee: NGK Spark Plug Co., Ltd., Japan

[21] Appl. No.: 835,194

[22] Filed: Mar. 3, 1986

[30] Foreign Application Priority Data

Mar. 4, 1985 [JP] Japan ............................ 60-30455[U]
Jun. 4, 1985 [JP] Japan ............................ 60-83460[U]
Jun. 4, 1985 [JP] Japan ............................ 60-83461[U]

[51] Int. Cl.$^4$ ........................................... H01L 23/06
[52] U.S. Cl. .................................. 174/52 FP; 73/754
[58] Field of Search ..................... 174/52 FP; 357/74; 73/754

[56] References Cited

U.S. PATENT DOCUMENTS 4,314,225 2/1982 Tominaga et al. ............... 73/754 X

FOREIGN PATENT DOCUMENTS 55-8955  3/1980 Japan .
55-37449 3/1980 Japan .
58-43355 9/1980 Japan .
59-13472 3/1984 Japan .

Primary Examiner—Arthur T. Grimley
Assistant Examiner—David A. Tone
Attorney, Agent, or Firm—Finnegan, Henderson, Farabow, Garrett and Dunner

[57] ABSTRACT

A device containing a semiconductor element having a substrate a cap over the substrate with a glass layer formed between the cap and the substrate providing a seal therebetween. Electrically conducting terminal members extend through the glass layer and connect with means for electrically connecting to the semiconductor element. A semiconductor mounting member is joined to the substrate and a semiconductor element having a coefficient of thermal expansion approximately equal to the semiconductor element mounted thereon.

13 Claims, 3 Drawing Sheets

DEVICE FOR MOUNTING SEMICONDUCTORS

BACKGROUND OF THE INVENTION

The present invention relates to a device mounting a semiconductor element such as a pressure sensor or a large semiconductor where the semiconductor element should strongly adhere to the substrate on which it is mounted.

A conventional device mounting an integrated circuit, semiconductor element or the like is depicted as device 31 in FIG. 1. Such a device comprises a ceramic substrate 34 on which is mounted a semiconductor element 33 by means of a joining layer 32 which is normally comprised of a metalized or plated layer on the substrate. A cap 35 is mounted by means of a glass layer 36 in such a manner that it protects the semiconductor element 33. The glass layer 36 provides a gas-tight seal between the ceramic substrate 34 and the cap 35. Terminal members 37 extend through the glass layer 36 from the outside of the device to a position adjacent the semiconductor element and are electrically connected thereto by means of electrical conductors.

Normally, the material used to form the ceramic substrate 34 is alumina or mullite which provide the requisite mechanical strength and electrical insulation characteristics. It should be noted, however, that the substrate on which the semiconductor element is mounted has a thermal expansion coefficient of $80 \times 10^{-7}/°C$. for alumina and $45 \times 10^{-7}/°C$. for mullite, while the semiconductor element which normally consists of silicon that has a coefficient of thermal expansion of $25 \times 10^{-7}/°C$. Therefore, when a large semiconductor element is mounted on such a substrate, thermal strain caused by differential thermal expansion between the two components during the joining operation decreases the yield and the durability of such a device. This is especially true when the device is used as a pressure sensor having a metal substrate because it may be cracked during its use at high temperatures.

Accordingly, there has been a strong demand for a device mounting a semiconductor element which is heat resistant, gas tight, and durable when subjected to vibration and which can be produced at a high yield at a low manufacturing cost.

Accordingly, it is an object of this invention to eliminate the above-described difficulties accompanying conventional devices of this type.

SUMMARY OF THE INVENTION

To achieve the above objects, there is provided a device containing a semiconductor element. The device comprises a substrate, a cap disposed to cover the semiconductor element with a glass layer joining the cap to the substrate and providing a seal therebetween. Terminal members extend from the exterior of the device through the glass layer to a position adjacent the semiconductor element. The terminal members are electrically conductive. Connecting means electrically connect the terminal members to the semiconductor element. A semiconductor mounting member is joined to the substrate and to the semiconductor element. The semiconductor mounting member has a coefficient of thermal expansion substantially equal to the semiconductor element.

In a preferred embodiment an opening or recess is provided in a portion of the substrate on which the semiconductor element is to be mounted. The semiconductor mounting member is placed in the opening recess in the substrate. It is further preferred that the semiconductor element mounting member be made of an inorganic material having a coefficient of thermal expansion less than or equal to about $10 \times 10^{-7}/°C$.

DESCRIPTION OF THE PREFERRED EMBODIMENTS

In accordance with the present invention, there is provided a substrate on which is mounted a semiconductor element. As will be disclosed in more detail hereinafter, the substrate may be formed of a ceramic material such as alumina or mullite or metal and in some embodiments a cap member is placed over the semiconductor element and bonded to the substrate by means of an intermediate glass layer. Terminal members formed of an electrically conductive material pass through the glass layer and are affixed to electrical connectors making the electrical connection to the semiconductor element.

Although the invention is a combination of elements, the present invention is directed primarily at the interface between the semiconductor element and the substrate. In accordance with the invention, there is provided a semiconductor mounting member that is joined to the substrate and the semiconductor element. The semiconductor mounting member has a coefficient of thermal expansion that is substantially equal to the semiconductor element. Preferably, the difference between the coefficient of thermal expansion of the semiconductor mounting member and the semiconductor element is less than or equal to $10 \times 10^{-7}/°C$.

One example of an inorganic material useful as the semiconductor mounting member in the present invention is a glass ceramic having a coefficient of thermal expansion in the range of from 24 to $27 \times 10^{-7}/°C$. This material is disclosed in Laid Open Japanese Patent Application No. 92943/84. This glass ceramic material is made by adding 0.1 to 6% $B_2O_3$ and/or $P_2O_5$ by weight to a mixture consisting of 54 to 63% $SiO_2$ by weight 20 to 28% $Al_2O_3$ by weight, 10 to 18% MgO by weight and 2 to 6% ZnO by weight. The mixture is pulverized into a frit and this frit is molded and sintered to form a crystalline and glass ceramic. Other materials operable as the inorganic semiconductor mounting member are silicon nitride having a coefficient of thermal expansion of $26 \times 10^{-7}/°C$., sialon with a coefficient of thermal expansion of $25 \times 10^{-7}/°C$. and silicon having a coefficient of thermal expansion of $25 \times 10^{-7}/°C$.

In embodiments where the device is used as a pressure sensor, an opening is formed through the semiconductor mounting member and that hole is aligned with a hole through the substrate such that the bottom surface of the semiconductor element comprises a closure of the opening. As will be discussed in more detail hereinafter, the opening may be in flow communication with a conduit. Preferably, the conduit is an iron-nickel-cobalt alloy (identified by the Trademark COBAL) with the conduit being affixed to the substrate in alignment with the hole therethrough.

The invention will now be further disclosed in terms of a number of specific embodiments thereof.

Figure 1:
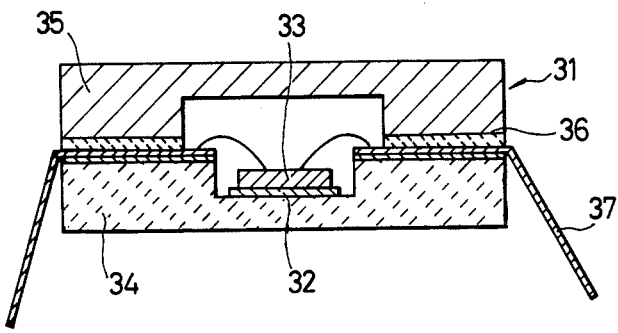
FIG. 1 is a cross-sectional side view of a conventional device mounting a semiconductor element.
Figure 2:
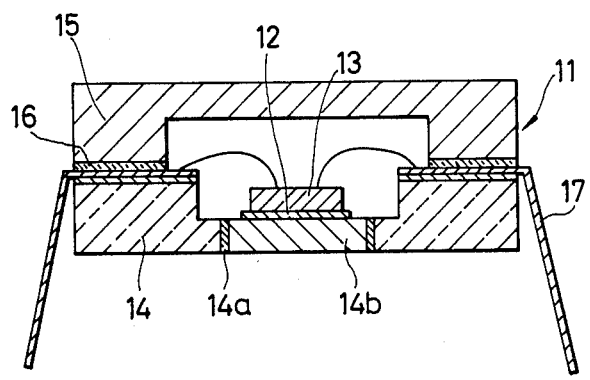
FIGS. 2 through 9 are cross-sectional side views of embodiments of the present invention.

FIG. 2 is a cross-sectional side view of a device containing an integrated circuit. In this embodiment the device 11, here an integrated circuit package or IC package, includes a substrate 14 of the same external configuration as the device depicted in FIG. 1. In the embodiment of FIG. 2, however, the substrate differs in that an opening is formed in the portion of the substrate 14 at the location where the semiconductor device 13 is affixed. An inorganic semiconductor mounting member 14b is inserted in the opening formed in the substrate 14. The gap 14a between the inorganic semiconductor mounting member 14b and the wall of the opening through the substrate 14 is filled and sealed with a glass having a thermal expansion coefficient between the thermal expansion coefficients of the substrate 14 and the inorganic semiconductor mounting member 14b. In this embodiment, the device includes a joining layer 12 between the semiconductor element 13, as well as a conventional cap 15, a glass layer 16 and terminal members 17 in the same basic configuration as those of the conventional device described above.

The device of FIG. 2 can also be effectively used if an opening is provided through the inorganic semiconductor mounting member 14b substantially at the center.

Figure 3:
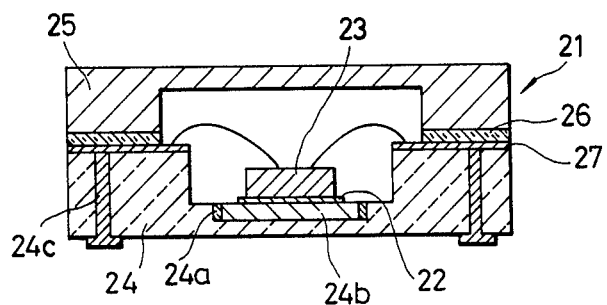

FIG. 3 depicts a second embodiment of the invention. In this embodiment, the device 21 has a substrate 24 having a recess formed therein. An inorganic semiconductor mounting member 24b is inserted in the recess formed in the substrate. The space 24a between the inorganic semiconductor mounting member 24b and the wall of the recess is filled and sealed with glass. The embodiment of FIG. 3 further includes a metalized layer of electrically conductive material 27 which is formed in a predetermined pattern on the upper surface of the substrate 24. The device has a joining layer 22 between the semiconductor element 23 and the semiconductor mounting member, as well as a conventional cap 25 and a glass layer 26 that are substantially equivalent in configuration and material to those of conventional devices described above.

Figure 4:
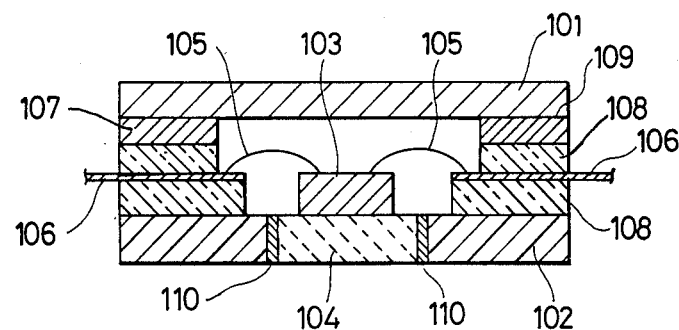

FIG. 4 is a cross-sectional view of a COBAL lead sealed, high melting point glass-type device known as a silvanier-type device.

In this embodiment the cap 101 for protecting the semiconductor element is made of an iron-nickel-cobalt alloy known as "42 alloy" or a similar material. The substrate 102 consists essentially of a metal made of the same material as the cap 101. A semiconductor element 103 and a semiconductor mounting member 104 comprise the other major elements of the deivce. The semiconductor mounting member 104 is comprised of a glass ceramic such as that disclosed by Laid Open Japanese Patent Application 92943/84, sintered silicon nitride, sialon or silicon having a thermal expansion coefficient substantially equal to the semiconductor element 103 which is comprised of silicon. The semiconductor element 103 is mounted on the semiconductor mounting member 104 which is in turn joined to the aforementioned metal substrate 102 with an iron-nickel-cobalt alloy sealing glass or a low melting point glass 110. In the embodiment of FIG. 4, the device includes electrical connecting wires 105 which connect the semiconductor element 103 to the lead wires 106. There is further provided a frame 107 which is joined and sealed to the cap 101 with a: Ag/Sn or glass sealing material. In addition, there is provided an iron-nickel-cobalt alloy sealing glass 108 that is used to join the cap 101 through the frame 107 to the substrate 102.

Such an embodiment by means of matching the thermal coefficients of expansion of the various components reduces or substantially eliminates damage to the semiconductor element 103 that could be caused by differential thermal expansion.

Figure 5:
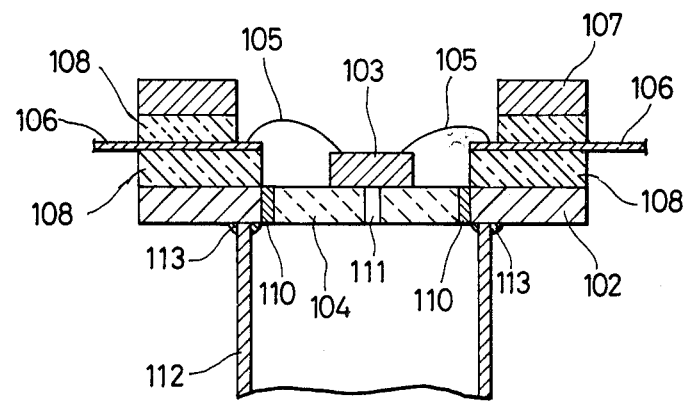

FIG. 5 shows an additional embodiment of the invention having a metal substrate 102 and a metal frame 107 that are joined together through an iron-nickel-cobalt alloy sealing glass 108 through which lead wires 106 are extended. A semiconductor mounting member 104 has a coefficient of thermal expansion that is substantially equal to the semiconductor element 103 has the semiconductor element 103 mounted thereon. An opening 111 through the mounting member 104 is located at a position where the semiconductor element 103 is placed. A metal conduit 112 is connected to the substrate 102 in such a manner that the metal conduit surrounds the opening 111 in the substrate. The device thus constructed can be used a pressure sensor that is operable without adversely affecting the operation of the semiconductor element 103.

The metal conduit 112 can be secured to the substrate 102 by means of a metalized layer 113.

Figure 6:
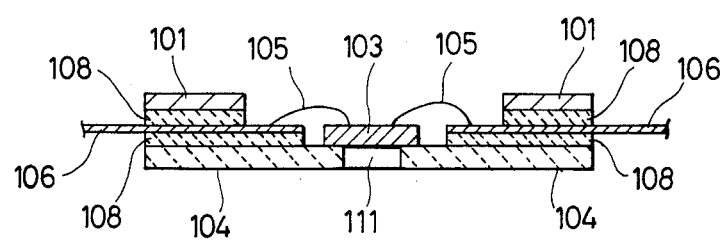

FIG. 6 shows another embodiment of the invention wherein the device includes a substrate 104 made of a ceramic material having a low coefficient of thermal expansion (less than about $35 \times 10^{-7}/°C$.) having an opening 111 formed therein. A silicon semiconductor element 103 is affixed to the substrate 104 on the substrate above the opening 111. The semiconductor element is connected by connecting wires 105 to the lead terminals 106. A frame 101 is bonded to a glass layer 108 comprised of an iron-nickel-cobalt alloy sealing glass through which the terminal members 106 pass. The sealing glass layer 108 is also affixed to the substrate 104 to provide a device for supporting a semiconductor device having an opening through the substrate.

The metal parts of this embodiment may be plated with gold to improve the corrosion resistance and reliability thereof.

Figure 7:
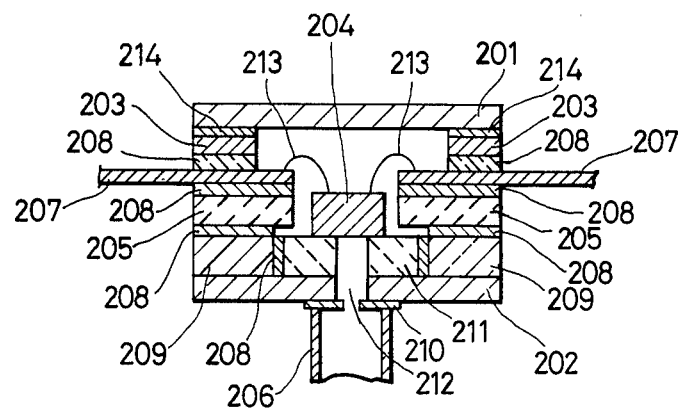
Figure 8:
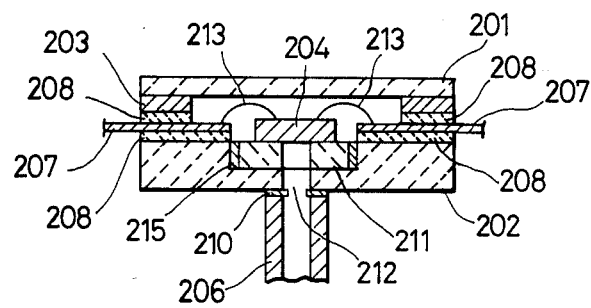

FIG. 7 depicts another embodiment of the invention having a ceramic cap 201 and a substrate 202 both formed of a ceramic as for example, alumina, having a coefficient of thermal expansion of approximately $80 \times 10^{-7}/°C$. A semiconductor element, here a silicon chip 204, is affixed to a semiconductor mounting member 211 which is affixed to the substrate 202. Alternatively, the semiconductor element may be affixed to the substrate by means of the mounting member 211 which is within a recess 215 within the substrate 202 as shown in FIG. 8. The semiconductor mounting member 211 has a coefficient of thermal expansion substantially equal to the semiconductor element 204. The semiconductor element 204 is connected to lead wires 207 by means of connecting wires 213 which are normally made of gold or aluminum, for example. The device further includes ceramic frames 203, 205 and 209 between the cap 201 and the substrate 202. The lead wires are sealed and the ceramic frames are affixed to one another by means of a glass having a low melting point and a coefficient of thermal expansion of about $60 \times 10^{-7}/°C$. The cap 201 is affixed to the frame 203 by means of a layer of metal soldering material, preferably affixed to a tunsten-molybdenum metallic layer 214.

The semiconductor mounting member 211 is comprised of a ceramic material having a low coefficient of thermal expansion, such as crystallized glass as disclosed in Laid Open Japanese Patent Application No. 92943/84, silicon carbide, silicon nitride or sialon. The mounting member 211 is sealed and joined to the substrate 202 or the frame 209 with a low melting point glass depicted here as the layer 208. An opening 212 is formed in the mounting member 211 in the substrate 202 in such a manner that the opening is closed by the semiconductor element 204. A conduit 206, preferably made of iron-nickel-cobalt alloy, such as the alloy identified by the Trademark COBAL or 42 alloy, is connected by means of a metalized layer 210 of a tungsten/molybdenum series metal to the substrate 202 surrounding the opening 212 with soldering material. The frame 203 can alternatively be made of the above-described iron-nickel-cobalt alloy instead of being comprised of a ceramic material.

FIG. 8 shows an additional embodiment of the invention and is similar to that of FIG. 7. In this embodiment, the ceramic frames of FIG. 7, 208 and 209, are not used and instead the substrate 202 is formed with a recess 215 in which the mounting member 211 is affixed to the substrate 202. The mounting member 211 is affixed within the recess 215 with a low melting point glass.

Figure 9:
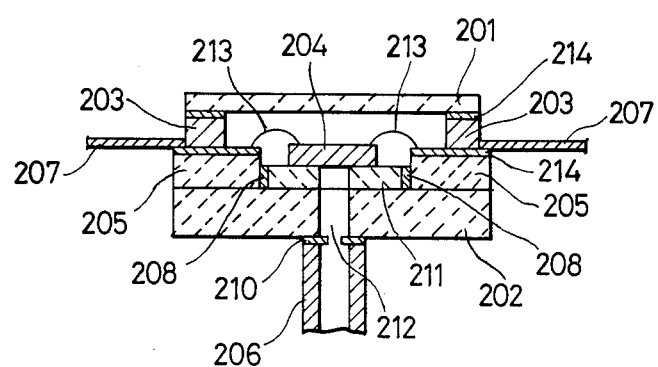

FIG. 9 shows an additional embodiment of the invention which is similar to the embodiment of FIG. 8. However, in this embodiment the connecting wires 213 leading to the semiconductor element 204 that are also connected to the lead wires 207 are connected through a metallic layer 214 made essentially of W and Mo.

In accordance with the present invention, there is provided a device containing an integrated circuit or semiconductor device wherein the semiconductor element is mounted on a material having a coefficient of thermal expansion that is substantially equal to that of the semiconductor element. The member on which the semiconductor is mounted is joined to the substrate. Therefore, even if the coefficient of thermal expansion of the substrate is different from that of the member on which the integrated circuit is mounted, the device can be formed without adversely affecting the performance of the semiconductor element used therein. In addition, if the invention is used in the embodiment wherein a conduit is affixed to the substrate, where the conduit has a coefficient of thermal expansion similar to that of the substrate, the conduit can be positively joined to the substrate, thereby providing an integral assembly.

A number of the devices constructed in accordance with the description herein were subjected to a thermal shock test under MIL-SDT-883 condition A (100° C.-0° C., 15 cycles). Testing revealed that the devices exhibited acceptable gas tightness. Furthermore, it was apparent from this testing that the semiconductor elements in the device were not damaged during the testing and the outlets in the embodiments used as pressure sensing devices had the conduits strongly affixed to the substrates after the test.

The devices manufactured according to the present invention have the advantage of being capable of being produced at a low manufacturing cost while protecting the semiconductor element used therein from damage due to thermal strain or the like. The devices exhibit excellent heat resistance and resistance to damage from vibration. Where the device itself is subjected to strain, as for example during assembly, the invention reduces the probability of the semiconductor element being cracked. The present invention is especially adapted to the production of a device that can be effectively used as a pressure sensor that is subjected to high pressures.

The present invention has been described in terms of preferred embodiments. The invention is not limited thereto. The scope of the invention is determined by the appended claims and their equivalents.

What is claimed is:

1. A device containing a semiconductor element, said device comprising:
    a substrate having an opening therethrough;
    a cap disposed to cover said semiconductor element;
    a glass layer joining said cap to said substrate and providing a seal therebetween;
    terminal members extending from the exterior of said device, through said glass layer, to a position adjacent said semiconductor element, said terminal members being electrically conductive;
    connecting means for electrically connecting said terminal members to said semiconductor element; and
    a semiconductor mounting member affixed within said opening of said substrate and joined to said semiconductor element, said semiconductor mounting member having a coefficient of thermal expansion substantially equal to said semiconductor element.

2. The device of claim 1 wherein said semiconductor mounting member is sealed as well as joined to said substrate.

3. The device of claim 1 wherein said substrate consists essentially of ceramic material.

4. The device of claim 1 wherein said substrate consists essentially of an alloy of iron, nickel and cobalt.

5. The device of claim 1 wherein said semiconductor mounting member consists essentially of an inorganic material having a coefficient of thermal expansion such that the difference between the coefficient of thermal expansion of said semiconductor mounting member and said semiconductor element is less than or equal to $10 \times 10^{-7}/°C$.

6. The device of claim 5 wherein said inorganic material consists essentially of a glass ceramic.

7. The device of claim 5 wherein said inorganic material consists essentially of silicon nitride.

8. The device of claim 5 wherein said inorganic material consists essentially of sialon.

9. The device of claim 5 wherein said inorganic material consists essentially of silicon.

10. The device of claim 5 wherein said substrate and said semiconductor mounting member each have a coextensive opening therethrough, said semiconductor element being mounted over said opening such that said opening exposes the bottom surface of said semiconductor element, said opening being further connected to a conduit such that said device can be used to detect pressure within said conduit.

11. The device of claim 10 wherein said semiconductor element is surrounded by frame means and said device further includes sealing material sealing said semiconductor mounting member and said substrate.

12. The device of claim 1 wherein said terminal members are comprised of metallic layers formed in a predetermined pattern on said substrate.

13. A device containing a semiconductor element, said device comprising:
    a substrate consisting essentially of a ceramic material, said substrate having an opening therethrough;
    a cap disposed to cover said semiconductor element;

a glass layer joining said cap to said substrate and providing a seal therebetween;

terminal members extending from the exterior of said device, through said glass layer, to a position adjacent said semiconductor element, said terminal members being electrically conductive;

connecting means for electrically connecting said terminal members to said semiconductor element; and a semiconductor mounting member joined to said substrate and said semiconductor element, said semiconductor mounting member having a coefficient of thermal expansion substantially equal to said semiconductor element, said semiconductor mounting member being affixed within said opening in said substrate.

* * * * *